United States Patent

Lidow

[11] Patent Number: 6,018,124
[45] Date of Patent: Jan. 25, 2000

[54] SELENIUM PHOTO GENERATOR CELL WITH FLUID TOP ELECTRODE

[76] Inventor: Nicholai Hart Lidow, 2428 The Strand, Hermosa Beach, Calif. 90254

[21] Appl. No.: 09/007,631

[22] Filed: Jan. 15, 1998

[51] Int. Cl.⁷ .................................................. H01L 31/00
[52] U.S. Cl. ........................ 136/264; 136/265; 136/252; 429/111; 429/218.1; 429/347
[58] Field of Search ................... 136/252, 264, 136/265; 429/111, 218.1, 347

[56] References Cited

U.S. PATENT DOCUMENTS

| | | | |
|---|---|---|---|
| 1,108,638 | 8/1914 | Stille | 429/111 |
| 1,375,474 | 4/1921 | Snelling | 338/17 |
| 1,697,451 | 1/1929 | Baird | 338/19 |

*Primary Examiner*—Bernard Codd
*Attorney, Agent, or Firm*—Ostrolenk, Faber, Gerb & Soffen, LLP

[57] ABSTRACT

A selenium photovoltaic cell has a top electrode formed of lemon juice or another fluid which enters into a chemical reaction with the selenium which produces a sulfur compound. A contact disk fixed to the selenium surface makes reliable contact to the fluid top electrode and provides a connection point for a top electrode lead.

7 Claims, 1 Drawing Sheet

SELENIUM PHOTO GENERATOR CELL WITH FLUID TOP ELECTRODE

FIELD OF THE INVENTION

The present invention relates to photoelectric generators and more particularly relates to a novel photoelectric cell having a novel electrode connection for a fluid electrode and to a process for the manufacture of the cell.

BACKGROUND OF THE INVENTION

Selenium photoelectric cells are well known and commonly consist of a layer of polycrystaline selenium deposited on one surface of an iron substrate plate. The selenium surface away from the plate (the top surface) receives a contact such as a conductive disk which serves as a first electrode while the iron plate substrate acts as the other electrode. The selenium surface is photosensitive and, when illuminated, will generate a potential between its two electrodes which can be used as a voltage source for electrical loads including meter loads. Selenium is also known to exhibit a marked change in resistance when exposed to light, and this resistance change can also be used for metering purposes.

It is also known that the electrode connected to the selenium surface can be a fluid, particularly, a liquid. Thus, U.S. Pat. No. 1,375,474 in the name of W. O. Snelling, issued Apr. 19, 1921 discloses a selenium based photoelectric apparatus in which a transparent electrode formed of a gelatine or starch paste or an aqueous salt solution or a dilute acid contacts the selenium surface. Other gels and oils are suggested as an electrode. Snelling also discloses a metal grid for making contact to the fluid electrode.

It is very difficult to form a grid electrode and to contact it without accidentally short circuiting the electrode to the iron plate substrate by puncturing the thin selenium layer. Further, only a limited output power can be produced with the electrode fluids proposed in the prior art.

It would therefore be very desirable to produce a selenium photoelectric device using a fluid electrode which can be easily and reliably contacted by an output lead and it would be desirable to employ a fluid which would produce an increased output electrical power from the cell.

BRIEF DESCRIPTION OF THE INVENTION

In accordance with the invention, a novel electrode is provided to permit a good low resistance connection to a fluid contact material, particularly, but not limited to an electrically conductive liquid contact material. Further, a novel fluid contact material is provided for a selenium photo electric layer consisting of a fluid such as lemon juice which chemically reacts with the selenium in the presence of incident radiation to produce a reaction having a sulfur component and a power output increase which is about six times that produced by a salt water electrode. The increased output power can then be used for any load, or could be stored for later use, as in a storage battery which is charged by the novel cell of the invention.

DETAILED DESCRIPTION OF THE DRAWINGS

Figure 1:
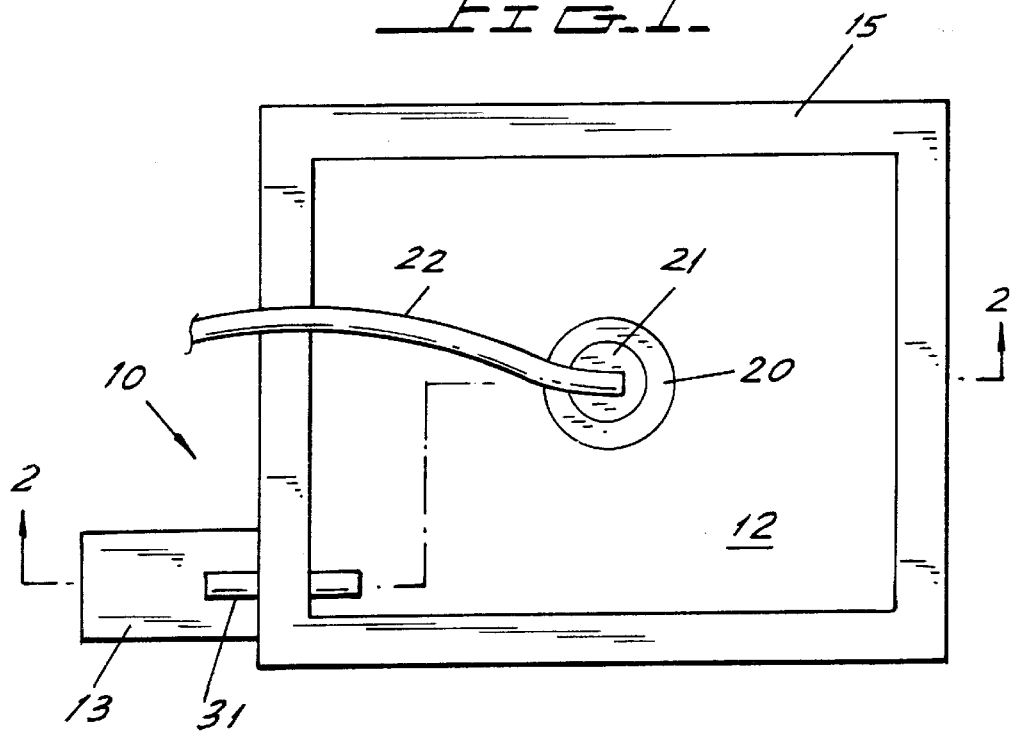
FIG. 1 is a top plan view of a selenium photo cell made in accordance with the present invention.
Figure 2:
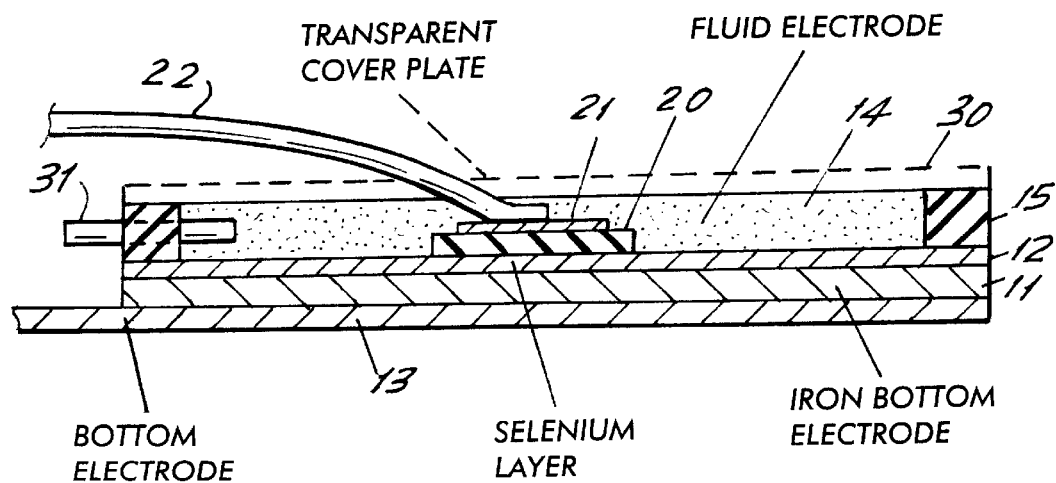
FIG. 2 is a cross-sectional view of FIG. 1, taken across section line 2—2 in FIG. 1.

Referring to FIGS. 1 and 2, there is shown a selenium photovoltaic cell 10 which consists of an iron substrate or plate 11, which may be a thin rectangular plate and which has a layer of polycrystaline selenium 12 deposited thereon by any desired well known process. Plate 11 may have any desired shape. An aluminum foil strip 13 is conductively secured, in any desired manner, to the bottom of iron substrate 11 to serve as a bottom electrode.

The top electrode for the photovoltaic cell 10 consists of a suitable transparent or translucent fluid 14 (FIG. 2) which is contained by dam 15 of any suitable electrical insulation material and which is secured to and sealed around the peripheral edge of the surface of selenium layer 12.

The thicknesses of plate 11, layer 12, and foil 13 are non-critical and can be those well known for use with known selenium photovoltaic cells. Dam 15 has a non-critical height, for example, ¼ inch and has been conveniently formed of a bead of glue or the like.

In accordance with one feature of the invention, and to insure a reliable low resistance connection to the top surface of selenium layer 12, a thin insulation washer 20 is first secured as by cementing, to the center of the surface of layer 12, and a conductive top disk 21, which may be copper is cemented atop washer 20. Copper wire output lead 22 is then connected to disk 21, by solder or by cement.

The total height of insulating washer 20 and conductive disk 21 is preferably less than the height of dam 15 so that, when the volume defined within dam 15 is filled with fluid electrode 14 the top surface of disk 21 will be at least partially and, preferably totally immersed in the fluid electrode 14. Thus, a good electrical connection can be made to the fluid electrode 14 without danger of damage to the selenium layer 12 and the short circuiting of cell 10. Note that the disk 21 may have the same area dimensions as washer 20, or can be slightly smaller, or can even over-hang the washer 20 to present a larger contact surface to the fluid 14. Further, washer 20 and disk 21 can have any desired topology.

It should be noted that while a single contact 21 is shown, a plurality of such contacts can be distributed over the surface of layer 12 to reduce resistance caused by lateral flow of electrons through the fluid 14 to a single current collection point. Note that the washer 20 has the smallest convenient area to avoid excessive blockage of the surface of selenium layer 12 to incident radiation.

When the fluid 14 is a non-viscous liquid, the top of the cell may be covered by a transparent cover plate 30 (shown in dotted lines in FIG. 2). Plate 30 may be glass or some other material which is transparent to the radiation which is incident on layer 12.

Where the cell 10 is to have a cover 30 and the fluid electrode 14 is to be contained against motion, a through connector 31 which extends through the retaining wall 15 in a sealed manner may be used. Thus, lead wire 22 can be connected to the connector 31 within the cavity defined by wall 15, while external connection is easily made to the exterior of connector 31.

In the above novel structure, any desired conductive fluid or electrolyte can be used as the fluid electrode. Thus, 3-in-1 oil ®, and citric juices have been tested. However, extraordinary results (higher power generation) have been obtained when using weakly acidic reagents which chemically react with selenium to produce sulfurous reaction components (identified by odor). More specifically, it was found that lemon juice used as the fluid electrode or electrolyte 14 produced an output power six times greater than that of all other fluids tested when the cell 10 was illuminated. This power output was also accompanied by a strong sulfur odor, indicating a chemical reaction which liberated sulfur from the reagents present (the selenium layer 12 and the lemon juice) during power generation.

The following table shows the results of tests of the structure of FIGS. 1 and 2 using salt water, vodka and lemon juice as the electrode 14, and demonstrates the dramatic power output increase when using lemon juice (which also generated the aforementioned strong sulfur odor) indicating a reaction of unknown origin. It is believed that this reaction may be responsible for the more than six-fold increase in power output over the use of salt water. In the experiment which is recorded in the following table, the cell of FIGS. 1 and 2 (without a cover 30) was placed under a 60 watt lamp and spaced about 6 inches from the lamp in an conventionally lit room. The "dark" reading is the cell power output due to ambient radiation and with the 60 watt lamp off, while the "light" reading is the cell power output reading when the lamp was on.

TABLE

| Fluid | Parameter measured | Light | Dark | Difference |
|---|---|---|---|---|
| Salt Water | Voltage (Volts) | −0.05 | 0.055 | −0.105 |
|  | Current (micro Amperes) | 2 | 6 | −4 |
|  | Resistance (Mega Ohms) | −0.015 | 0.36 | −0.42 |
|  | Power (Micro Watts) |  |  | 0.42 |
| Vodka | Voltage (Volts) | 0.14 | 0.32 | −0.18 |
|  | Current (micro Amperes) | 0.3 | 0.8 | −0.5 |
|  | Resistance (Mega Ohms) | 1.3 | 1.5 | −0.2 |
|  | Power (Micro Watts) |  |  | 0.09 |
| Lemon Juice | Voltage (Volts) | −0.056 | 0.048 | −0.104 |
|  | Current (micro Amperes) | −7 | 18 | −25 |
|  | Resistance (Mega Ohms) | 0.5 | 3.3 | −2.8 |
|  | Power (Micro Watts) |  |  | 2.6 |

The following describes the process steps which were used to produce the structure of FIGS. 1 and 2, and further describes some of the tests performed.

In order to obtain a working cell the selenium was melted onto the iron and was annealed (to change to a poly crystal form). The selenium was heated in an oven at just below its melting point for one hour. The selenium 12 was then poured on and spread thinly over the surface the iron square 15 which was previously sterilized. In a first test the selenium was heated at an oven temperature reading of about 413 degrees Fahrenheit (approximately 10 degrees below selenium's melting point), for one hour. After pouring on the iron square and annealing, the selenium lost its shininess and turned a dull, bluish color. This was probably because it changed into the poly crystal form. The highest temperature the selenium can be annealed at without melting is believed to be the most efficient because the closer to the melting point, the easier it is for the selenium to recrystallize.

A number of cells so produced were tested, using salt water, and generated about 0.23 volts. It was also found that when the cells were placed in darkness, the voltage became unstable, oscillating between 0.16 and 0.23 volts. The cells were also tested using a layer of graphite spread thinly over the surface, but a good enough connection was not obtained to get a reading. It is believed that the unstable, low voltages and the sporadic behavior of the cells was because of a continuous short circuit produced during the connection of leads. Thus, the ends of the volt meter are too thick to only contact the saltwater and not the selenium. Once they would touch the selenium, it would cause an immediate short circuit.

Alcohol (vodka) was next used for fluid electrode 14. The alcohol produced a higher output voltage, but in less than ten minutes the cell was useless. 3-in-1 oil was next tested, but it produced no significant voltage.

The cells were made easier to handle by hot-gluing electrode system 20–21 to the center of the solar cell 10 to prevent accidental short-circuits. The edge of the cell was beaded with glue 15 to hold the conductive liquids 14 and to prevent spilling. The novel conductive contact disk 21 in the center of the cell area allowed contact to the cell fluid 14 without danger of shorting the cell.

Several fluids were tested, including salt water, vodka, and lemon juice. Each was tested for voltage output (in the light, and in the dark), current output (light and dark), and resistance (light and dark). The power each cell generated was calculated by multiplying the voltage by current as shown in the above table. Lemon juice produced by far the most power for a very interesting reason. When exposed to light, the selenium and the lemon juice underwent a chemical reaction and produced a strong sulfur odor. The chemical reaction produced more than six times as much power as salt water and could be used as a new way to store energy.

While the above describes the fluid electrode volume 14 as a static volume, it should be noted that the volume can be arranged to be easily drained and replaced in a batch manner, or if desired, to be renewed in a continuous manner.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A photovoltaic cell comprising:

a flat metal base plate;

a layer of selenium supported on an upper surface of said flat metal base plate and processed to produce an output voltage relative to said base plate when a surface of said selenium is exposed to radiation;

a fluid electrode confined against an upper surface of said selenium layer, said fluid electrode being comprised of lemon juice; and an electrical contact disk supported with respect to said selenium layer and having a conductive lead extending therefrom;

wherein said electrical contact disk is at least partially immersed in said fluid electrode.

2. The photovoltaic cell of claim 1 in which said flat metal plate is an iron plate.

3. The photovoltaic cell of claim 1 further comprising a fluid dam which encloses said upper surface of said selenium layer to confine said fluid electrode within a volume defined by said upper surface of said selenium layer and an interior surface of said dam.

4. The photovoltaic cell of claim 3 wherein an insulation disk is fixed between said selenium layer and said electrical contact disk.

5. The photovoltaic cell of claim 4 wherein said electrical contact disk is fully immersed in said fluid electrode.

6. The photovoltaic cell of claim 1 wherein an insulation disk is fixed between said selenium layer and said electrical contact disk.

7. The photovoltaic cell of claim 1 wherein said electrical contact disk is fully immersed in said fluid electrode.

* * * * *